(12) United States Patent
Behara et al.

(10) Patent No.: US 7,873,101 B2
(45) Date of Patent: Jan. 18, 2011

(54) LOW LATENCY DIGITAL FILTER AND METHOD

(75) Inventors: Raghuram P. Behara, Langhorne, PA (US); Thomas J. Meyer, Mercerville, NJ (US); Yiwen Yu, Holland, PA (US); Ajay Bhaskaran, Bangalore (IN); Raul A. Casas, Doylestown, PA (US)

(73) Assignee: Broadcom Corporation, Irvine, CA (US)

( * ) Notice: Subject to any disclaimer, the term of this patent is extended or adjusted under 35 U.S.C. 154(b) by 1433 days.

(21) Appl. No.: 11/090,478

(22) Filed: Mar. 25, 2005

(65) Prior Publication Data

US 2006/0215746 A1 Sep. 28, 2006

(51) Int. Cl.
*H03H 7/30* (2006.01)
(52) U.S. Cl. .................................. 375/232; 713/300
(58) Field of Classification Search ................ 375/232, 375/340, 350
See application file for complete search history.

(56) References Cited

U.S. PATENT DOCUMENTS

| | | | | |
|---|---|---|---|---|
| 3,988,607 A * | 10/1976 | Eggermont et al. | ......... | 708/313 |
| 4,521,866 A * | 6/1985 | Petit et al. | .................... | 708/313 |
| 5,513,223 A * | 4/1996 | Shoji | .......................... | 375/350 |
| 5,742,694 A * | 4/1998 | Eatwell | ..................... | 381/94.2 |
| 5,831,879 A * | 11/1998 | Yom et al. | ................... | 708/301 |
| 5,838,725 A * | 11/1998 | Gurusami et al. | ........... | 375/229 |
| 5,983,255 A * | 11/1999 | Musicus et al. | ............. | 708/300 |
| 6,175,599 B1 * | 1/2001 | Lyon et al. | .................. | 375/261 |
| 6,367,003 B1 | 4/2002 | Davis | | |
| 6,983,012 B1 * | 1/2006 | Shen | .......................... | 375/229 |
| 7,333,539 B2 * | 2/2008 | Glendenning | ............... | 375/232 |
| 2002/0150155 A1 * | 10/2002 | Florentin et al. | ............ | 375/233 |
| 2003/0033337 A1 * | 2/2003 | Iwasaki | ...................... | 708/300 |
| 2004/0093530 A1 * | 5/2004 | Watts | ......................... | 713/300 |

* cited by examiner

*Primary Examiner*—David C Payne
*Assistant Examiner*—Leon-Viet Q Nguyen
(74) *Attorney, Agent, or Firm*—McAndrews, Held & Malloy, Ltd.

(57) ABSTRACT

A digital filter pre-calculates $C(1)*S(n-1)$, $C(2)*S(n-2)$ ... $C(p-1)*S(n-p+1)$, prior to the arrival of sample $S(n)$. As such $$y(n) = \sum_{k=0}^{k=p-1} C(k)*S(n-k)$$

may be calculated as a result of a single further multiply and accumulate operation, upon arrival of the symbol $S(n)$. This, significantly reduces the latency of the filter.

19 Claims, 8 Drawing Sheets

LOW LATENCY DIGITAL FILTER AND METHOD

FIELD OF THE INVENTION

The present invention relates generally to digital signal processing methods and devices, and more particularly to low latency digital filters.

BACKGROUND OF THE INVENTION

The finite impulse response (FIR) filter is a basic digital signal processing building blocks. In its most basic form, a p-tap FIR filter transforms an incoming time domain signal S, formed of symbols S=S(0)S(1) . . . S(j), to produce $$y(n)=C(0)S(n)+C(1)S(n-1)+C(2)S(n-2)\ldots C(p-1)S(n-p+1) \quad (1)$$

C(0), C(1), C(2) . . . C(p−1) are said to be the filter coefficients. FIR filters are detailed generally in A. V. Oppenheim and R. W. Schafer, "Discrete-Time Signal Processing" Prentice-Hall, Englewood Cliffs, N.J. 1989, the contents of which are hereby incorporated by reference.

Proper choice of filter coefficients C(0)(1) . . . C(2), in turn, allows the filter to transform the incoming signal in a multitude of ways.

As is readily appreciated, each output of a p-tap FIR filter relies on p symbols of the incoming signal S. So, typical FIR filter implementations as for example detailed in U.S. Pat. No. 6,367,003 buffers the p incoming samples, and performs the entire calculation of equation (1) to determine the filter output y(n), after arrival of the $n^{th}$ sample S(n).

The delay (or latency) of the filter after arrival of the $n^{th}$ sample is equal to the time required to perform p filter calculations. For many real time applications, significant delay is not tolerable. As such, the rate at which calculations are performed is typically greater than the symbol arrival rate. However, there are practical limits to the rate at which filter calculations are performed, introduced by such things as filter power requirements, electrical interference, and the like.

Accordingly, there is a need for a DSP FIR filter that introduces less delay than conventional DSP FIR filters.

SUMMARY OF THE INVENTION

In accordance with the present invention, a FIR filter pre-calculates C(1)*S(n−1), C(2)*S(n−2) . . . C(p−1)*S(n−p+1), prior to the arrival of sample S(n). As such $$y(n) = \sum_{k=0}^{k=p-1} C(k)*S(n-k)$$

may be calculated as a result of a single further multiply and accumulate operation, upon arrival of the symbol S(n). This, significantly reduces the latency of the filter.

In accordance with a first aspect of the present invention, a method of filtering a digital stream of symbols S(i) using a $p^{th}$ order finite impulse response filter having filter coefficients C(0)C(1) . . . C(p−1), includes pre-calculating the sum $$\sum_{k=1}^{k=p-1} C(k)*S(n-k)$$

between the arrival of the $(n-1)^{th}$ and $n^{th}$ symbol. Upon arrival of the $n^{th}$ of the symbols, $$Y(n) = \sum_{k=0}^{k=p-1} C(k)*S(n-k)$$

using the pre-calculated sum, is calculated prior to the arrival of the $(n+1)^{th}$ symbol.

In accordance with yet another aspect of the present invention, a digital filter, includes a symbol buffer having p−1 storage locations for storing arriving symbols, a coefficient memory having p−1 storage locations; a counter for counting from k=0 to p−1; and a multiply and accumulate (MAC) block for multiplying and accumulating C(k)*S(n−k) from the storage locations of the symbol buffer and the coefficient memory. The counter provides control signals to cause the MAC block to calculate, $$\sum_{k=1}^{k=p-1} C(k)*S(n-k)$$

between the arrival of the $n-1^{th}$ and $n^{th}$ of the symbols; and, upon arrival of the $n^{th}$ of the symbols, calculate $$Y(n) = \sum_{k=0}^{k=p-1} C(k)*S(n-k).$$

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate by way of example only, embodiments of the present invention.

DETAILED DESCRIPTION

Figure 1:
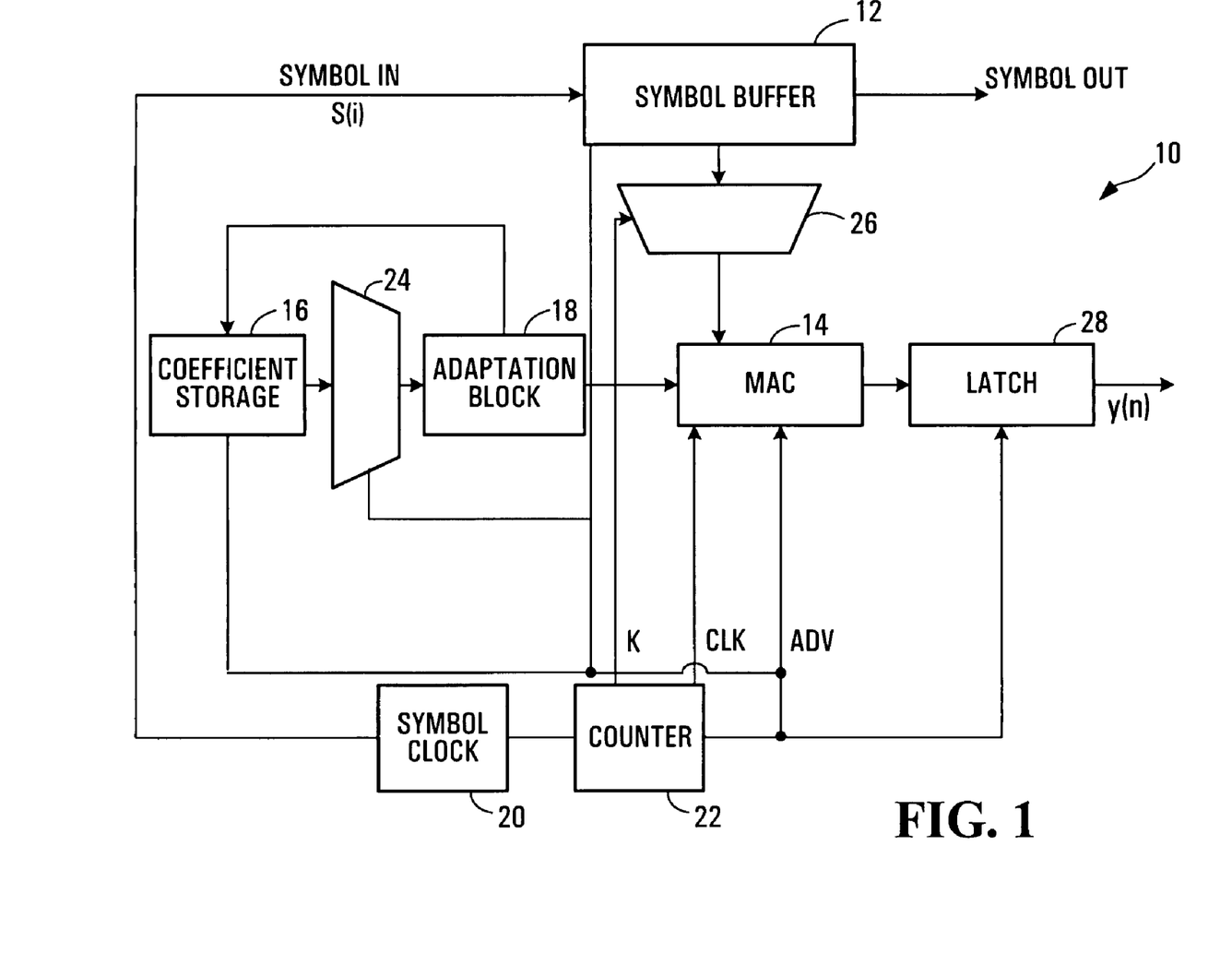
FIG. 1 is a block schematic diagram of a filter exemplary of an embodiment of the present invention.

FIG. 1 illustrates a digital filter 10, exemplary of an embodiment of the present invention.

Filter 10 is a p tap FIR digital filter, suitable for filtering an incoming stream of symbols S(i), in accordance with the time domain transfer function, $$y(n) = \sum_{k=0}^{k=p-1} C(k) * S(n-k)$$

where C(i) are the coefficients of the FIR filter.

As will be appreciated, coefficients C and symbols S may be real or complex, and may thus be expressed as $C(k)=C_I(k)+jC_Q(k)$, and $S(k)=S_I(k)+jS_Q(k)$, with $C_I$, $S_I$ and $C_Q$, $S_Q$ representing real and imaginary components, respectively of C and S. For purposes of illustration only, $S_I$, $S_Q$, $C_I$ and $C_Q$ are assumed to take m=8 bit values.

As illustrated, filter 10 includes a symbol buffer 12, storing arriving symbols S and providing symbol values to multiply and accumulate (MAC) unit 14, by way of a data selector 26. Coefficient memory 16 is further in communication with MAC unit 14, by way of a data selector 24. Optionally, a coefficient adaptation block 18 may be interposed between selector 24 and MAC unit 14, to make filter 10 adaptive. A symbol clock generator 20 generates clock pulses upon the arrival of symbols S, and is used to reset an internal clock/counter 22 used by filter 10, as detailed below. A latch 28 may latch filter output values calculated by MAC unit 14.

For reasons that will become apparent, clock/counter 22 generates a count k from 0 to p−1, after being reset by symbol clock 20. With each count, a clock pulse is output on line CLK. As count k transitions from 0 to 1, an advance signal is output on line ADV. Clock/counter 22 increments at rate that is at least p times as great as the average symbol rate R.

MAC unit 14 calculates, $$\sum_{k=0}^{k=p-1} C(k) * S(n-k).$$

Figure 2:
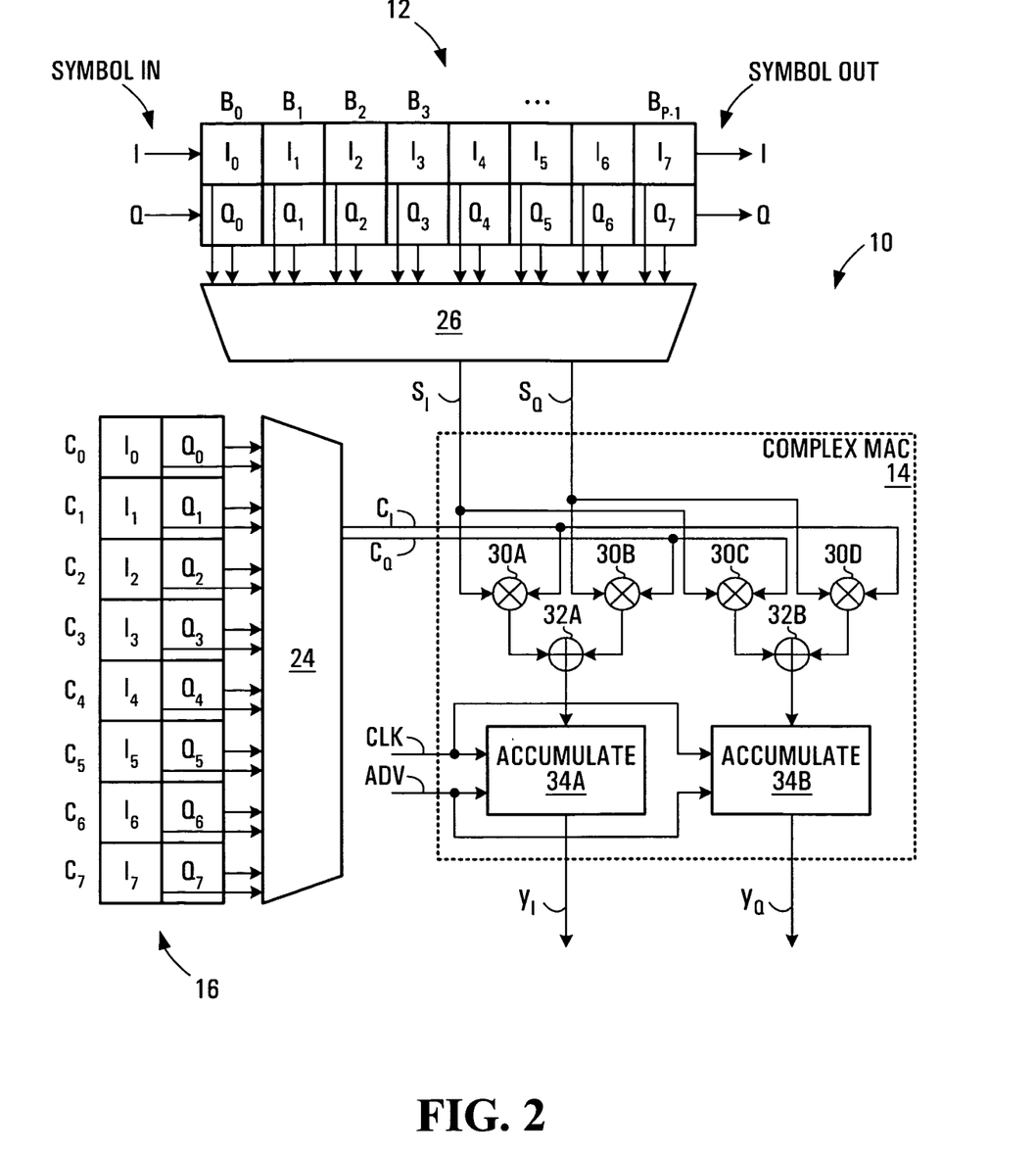
FIG. 2 is a block diagram of a portion of the filter of FIG. 1

A schematic block diagram of an example MAC unit 14, buffers 12 and 16 is illustrated in FIG. 2. As illustrated, MAC unit 14 includes four multipliers 30a, 30b, 30c, and 30d; two summers 32a, 32b; and two accumulate blocks 34a and 34b. Selectors 24 and 26 driven by clock/counter 22 select location k of buffers 26 to provide to MAC unit 14. Thus, inputs of multipliers 30a are provided with inputs $S_I(k)$ and $C_I(k)$; inputs of multipliers 30b are provided with $S_Q(k)$ and $C_Q(k)$; inputs of multiplier 30c is provided with input $C_Q(k)$ and $S_Q(k)$ and inputs of multiplier 30d are provided with inputs $C_I(k)$ and $S_Q(k)$. Outputs of multipliers 30a and 30b are subtracted by adder 32a. Outputs of multipliers 30c and 30d are summed by adder 32b. Multipliers 30a, 30b, 30c and 30d thus take two m-bit inputs to produce a 2m-bit output. Adders 32a and 32b are 2m-bit adders.

Adder 32a thus calculates $S_I(k)*C_I(k)−S_Q(k)*C_Q(k)$.

Adder 32b calculates $C_Q(k)*S_I(k)+S_Q(k)*C_I(k)$.

Put another way, adders 32a and 32b output real and imaginary portions of the complex product $(S_I+jS_Q)*(C_I+jC_Q)$. Outputs of adders 32a and 32b are respectively provided to accumulate blocks 34a and 34b. In the example embodiment, with m=8, accumulate blocks 34a and 34b are sixteen bit accumulate blocks that sum values at their inputs to previously accumulated values upon transition of a pulse, at line ADV. The values of accumulate blocks 24a and 24b may be reset to zero upon receipt of reset signal on line CLR.

The organization of symbol buffer 12 is also illustrated in FIG. 2. As illustrated, symbol buffer 12 includes a plurality of p sixteen-bit storage elements, each labelled $B_0, B_1, B_2 \ldots B_{p-1}$. The number of storage elements, p, represents the number of taps of the filter 10. In the disclosed embodiment of FIG. 1, symbol buffer 12 includes eight, sixteen bit storage elements. Each memory storage element is sufficient in size to store both real and imaginary components of arriving symbols, $S_I$ and $S_Q$. Thus, in the disclosed embodiment, each storage element is sufficient in size to store eight bit real and imaginary components.

Buffer 12 is a first-in, first-out (FIFO) buffer. A buffer advance input causes the buffer to advance. That is, buffer 12 acts in a manner similar to a shift register: a buffer advance signal at line ADV causes elements within buffer 12 to be shifted right, from one storage element into the adjacent storage element. The value of the right-most storage element may optionally be output by buffer 12, for cascading of buffers/filters as detailed below.

A data selector 26 interconnects symbol buffer 12 to MAC unit 14. Data selector 26 is a eight (p) sixteen bit input, two eight bit output data selector that selects which of the eight storage locations of buffer 12 are provided as outputs $S_I$ and $S_Q$.

The organization of coefficient memory 16 is similarly illustrated in FIG. 2. Again, buffer includes p storage locations each labelled $C_0, C_1, \ldots C_{p-1}$ capable of storing a sixteen (16) bit value, representing real and imaginary coefficients of coefficients C. Coefficient memory 16 is p−1 location memory. It need not be a FIFO like buffer 12, as values are typically not shifted within the buffer. Again, each location within coefficient memory 16 is sufficient to store a coefficient value. In the depicted embodiment, coefficient memory 16 is capable of storing real and imaginary components of complex valued coefficients. A data selector 26 selects which of the p storage locations is presented at its outputs as values components $C_I$ and $C_Q$.

In operation, symbols arrive at buffer 12. As the current symbol $S(i)=(S_I, S_Q)$ is stored in location 0 of buffer 12. Upon the arrival of each symbol, a symbol synch pulse is generated by clock 20, to initialize clock/counter 22. Clock/counter 22 counts from k=0 to p−1. Selectors 24 and 26 are controlled by the value k of clock/counter 22 to provide the $k^{th}$ buffer location of interconnected buffers 12, 16 to MAC unit 14.

When the counter value k transitions to a value of 1, the decoder, strobes the ADV line and resets accumulators 24a and 24b of MAC unit 14 (FIG. 2). At the same time, the ADV line strobes the buffer advance control input of buffer 12 causing buffer 12 to right shift its stored values. Clock/counter 22 continues to count from k=1 to p−1. Thus, once clock/counter 22 reaches a value of p−1, accumulators 24a and 24b will have intermediate accumulated values (i.e. partial sums), $$X_I(n) = \sum_{k=1}^{k=p-1} S_I(n-k)*C_I(k) - S_Q(n-k)*C_Q(k)$$

for accumulator 24*a*, and $$X_Q(n) = \sum_{k=1}^{k=p-1} S_I(n-k)*C_Q(k) + S_Q(n-k)*C_I(k)$$

for accumulator 24*b*.

Figure 3:
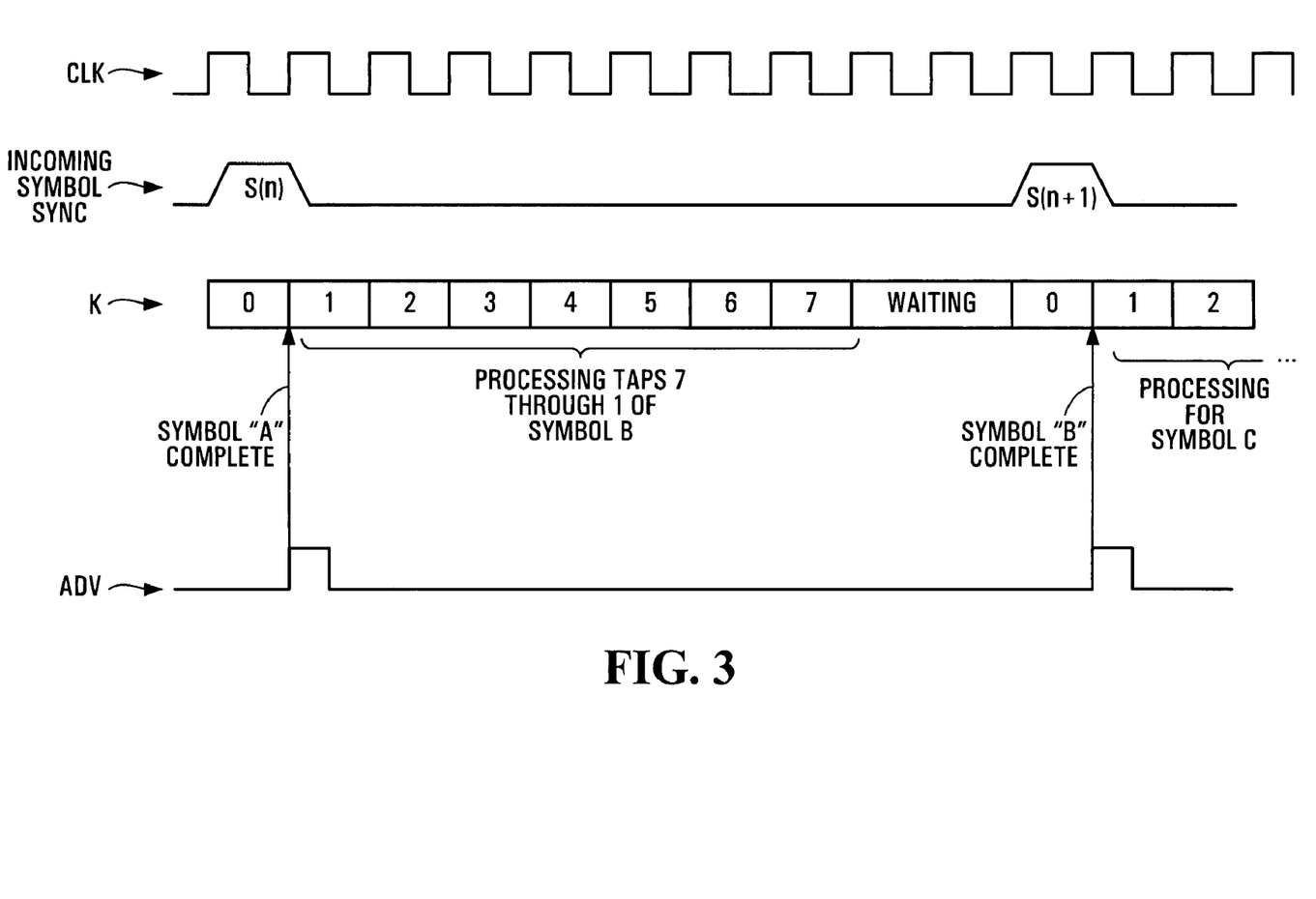
FIG. 3 is a signal timing diagram for the filter of FIG. 1.

The value k of clock/counter 22 and the generation of a CLK and ADV signals are illustrated in FIG. 3.

As will now be appreciated, upon arrival of the next symbol S(n), $y_I(n)$ and $y_Q(n)$ may be calculated as $$y_I(n)=X_I(n)+S_I(n)*C_I(0)-S_Q(n)*C_Q(0),$$

and $$y_Q(n)=X_Q(n)+S_I(n)*C_Q(0)+S_Q(n)*C_I(0).$$

Conveniently, this requires only a single calculation by MAC unit 14 (i.e. a single calculation by each of multipliers 30*a*, 30*b*, 30*c* and 30*d* and accumulate blocks 32*a* and 32*b*).

As noted, buffer 12 stores each arriving symbol S(i) in its $0^{th}$ location. So, as S(n) arrives, it will be stored in location 0 of buffer 12. S(n) will thus be presented to MAC unit 14 as the value of clock/counter 22 advances from p−1 to 0. MAC unit 14 thus calculates $y_Q(n)$ and $y_I(n)$, after one transition of clock/counter 22. The output of MAC unit 14 may optionally be latched in storage element 28 (FIG. 1).

As counter 22 increments to a value of 1, S(n) is shifted into the first location of buffer 12, and $X_I(n+1)$, and $X_Q(n+1)$ may be pre-calculated as clock/counter 22 is increments from k=1 to k=p−1. Again, upon the arrival of S(n+1), $y_I(n+1)$ and $y_Q(n+1)$ are calculated.

Figure 4:
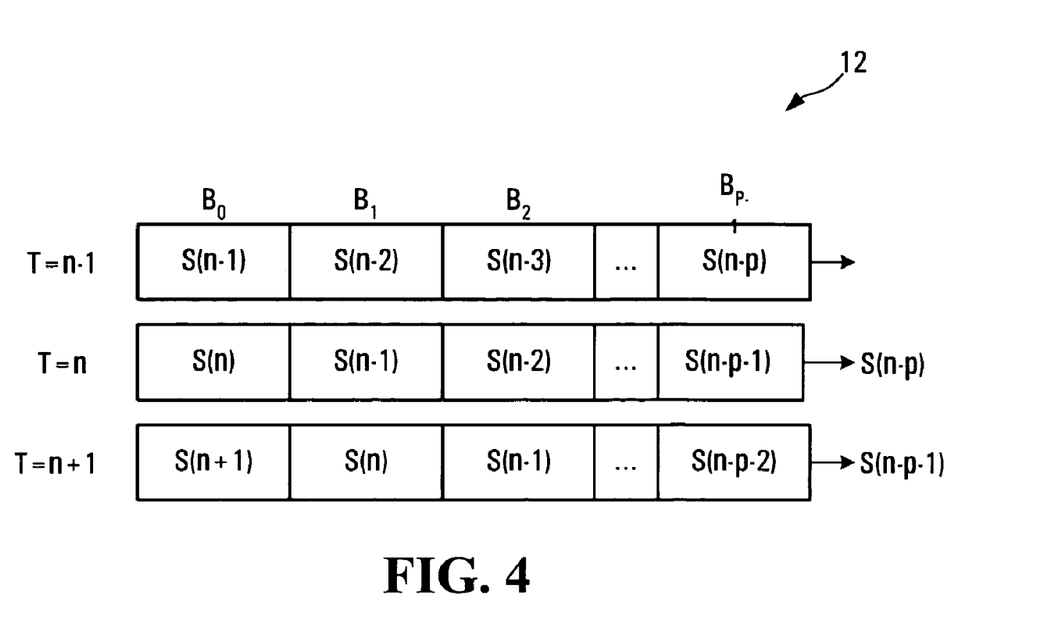
FIG. 4 is a schematic diagram depicting the contents of a symbol buffer of the filter of FIG. 1, for three sequential symbols.

For convenience, the contents of buffer 12 for the arrival of symbols S(n−1), S(n) and S(n+1) are illustrated in FIG. 4.

Conveniently, at steady state, the latency between the arrival of each symbol S(n) and filter output y(n) is only a single transition of clock/counter 22, after the arrival of symbol S(n).

Optionally, filter 10 could be made adaptive by updating filter coefficient C(k). This may be effected by adaptation block 18 operating on the values of C(k) at the same time as $X_I$ and $X_Q$ are pre-calculated. Adapted filter coefficient values could be placed within coefficient memory 16, at some time between the use of the filter coefficient, and the next use of that filter coefficient.

Figure 5:
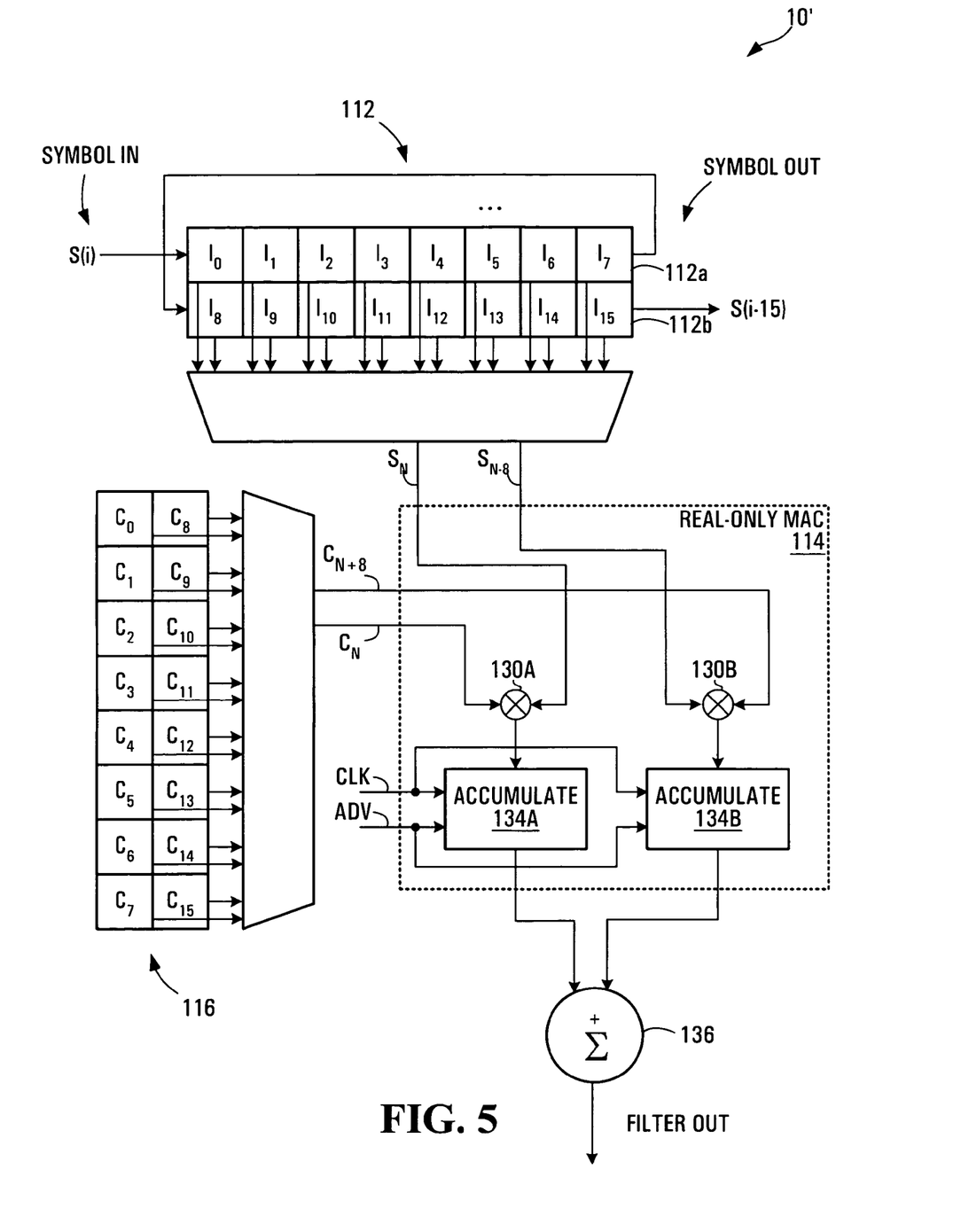
FIG. 5 is a block diagram of an alternate filter exemplary of another embodiment of the present invention.

Filter 10 may easily be modified to operate on only real valued coefficients and symbols. FIG. 5 accordingly illustrates filter 10', so modified. Filter 10' may be operated as a sixteen tap filter operating on eight bit symbol and eight bit coefficients.

Buffer 112 is like buffer 12 (FIG. 2), but includes two buffers 112*a* and 112*b* each having eight, eight-bit, storage values cascaded in series. Again the buffers 112*a* and 112*b* act as FIFO buffers, and may have their contents shifted right upon receipt of an advance signal at the ADV line. The output of buffer 112*a* is connected to the first storage location of buffer 112*b*. Thus, as buffer 112*a* is advanced, the value in its final storage location is shifted into the first storage location of buffer 112*b*. Likewise coefficient memory 116 may hold sixteen eight bit coefficients.

As illustrated, MAC unit 114 includes two multipliers 130*a* and 130*b* calculating, C(k)*S(k), and S(k−8)*C(k+8)

So, MAC unit 114 contemporaneously calculates the partial sums $$F_1(n) = \sum_{k=0}^{k=p-1} S(n-k)*C(k)$$

$$F_2(n) = \sum_{k=0}^{k=p-1} S(n-k-8)*C(k+8)$$

As explained with reference to filter 10 and FIGS. 2 and 3, the output of MAC unit 14 (and likewise MAC unit 114 and $F_1(n)$ and $F_2(n)$) are output one clock cycle of clock generator 22 after the arrival of S'(n). An adder 136, in turn sums the partial sums output by accumulate blocks 134*a* and 134*b*. Bit i of each partial sum $F_1$ and $F_2$ are added.

Figure 6:
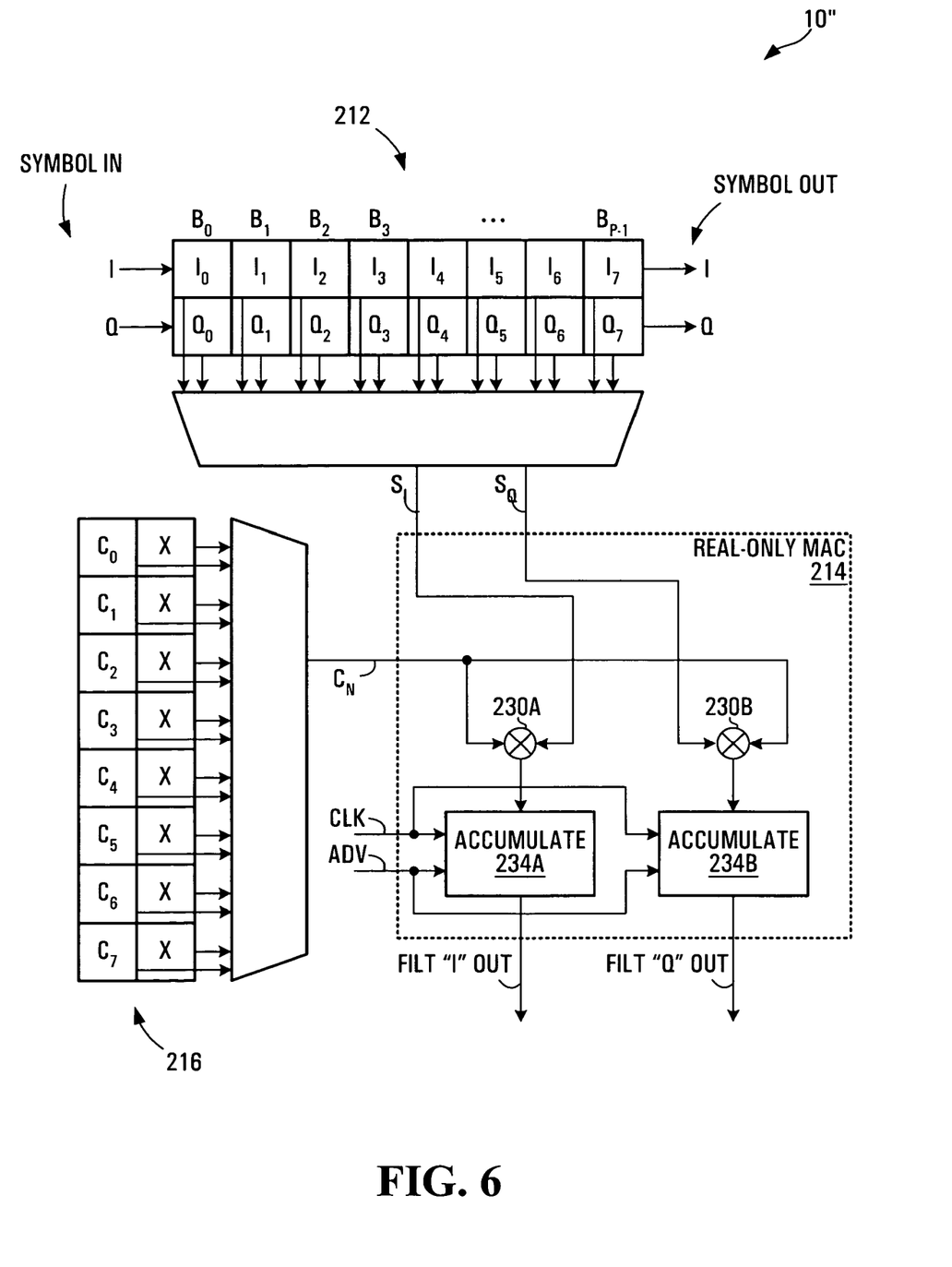
FIG. 6 is a block diagram of an alternate filter exemplary of another embodiment of the present invention.

In yet another alternate embodiment, depicted in FIG. 6, filter 10" may be modified to operate on complex valued symbols S(i) and eight-bit real-valued coefficients C. Filter 10" accordingly includes MAC unit 214 that calculates $$y_I(n) = \sum_{k=0}^{k=p-1} C(k)*S_I(n-k), \text{ and } y_Q(n) = \sum_{k=0}^{k=p-1} C(k)*S_Q(n-k)$$

Once again, $y_I(n)$ and $y_Q(n)$ may be calculated a fraction of symbol clock cycle after the arrival of S(n).

A person of ordinary skill will readily appreciate that filters 10, 10' and 10" may actually be formed as a single configurable filter, using conventional large (or very large) scale integration (LSI/VLSI) design and fabrication techniques. That is, configuration inputs (not shown) may select which one of three configurations are enabled, allowing simple reconfiguration of a single filter to operate in one of the three depicted modes.

The above described filters 10, 10' and 10" may be combined to form higher order or higher precision filters.

Figure 7:
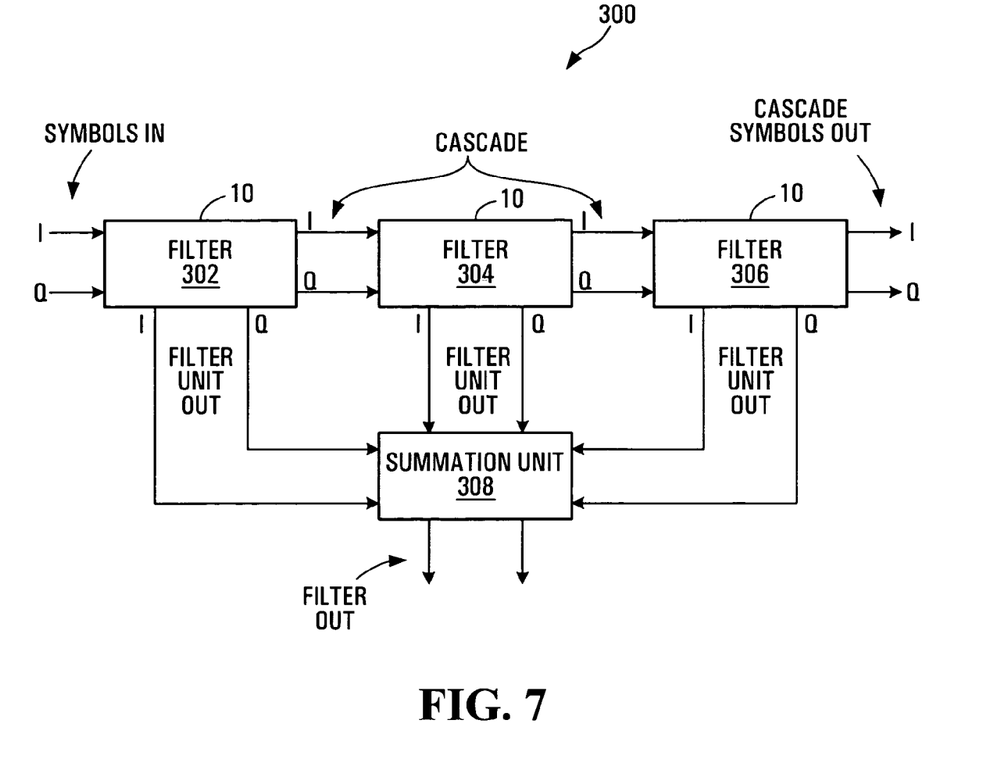
FIG. 7 is a schematic block diagram of a higher order filter formed using the filter of FIG. 1.

For example, FIG. 7 illustrates a filter 300 formed by cascading three filters 10 (FIG. 1). Symbols shifted out of symbol buffer 12 of a first filter 302 are shifted into a symbol buffer 12 of a second filter 304. Similarly, symbols shifted out of symbol buffer 12 of second filter 304 are shifted into symbol buffer 12 of a third filter 306. Each filter is of the form of filter 10 and thus calculates a p tap FIR filter value. The outputs of the three filters 302, 304 and 306 are provided to a summer 308. Summer 308 sums the real and imaginary outputs of the three filters 302, 304 and 306 to provide a q=3p tap filter output. Because the latency of each filter 302, 304 and 306 is equal, filter 300 has a latency equivalent to filter 10 (i.e. a fraction of a symbol cycle). Other q tap filters may similarly be formed.

Figure 8:
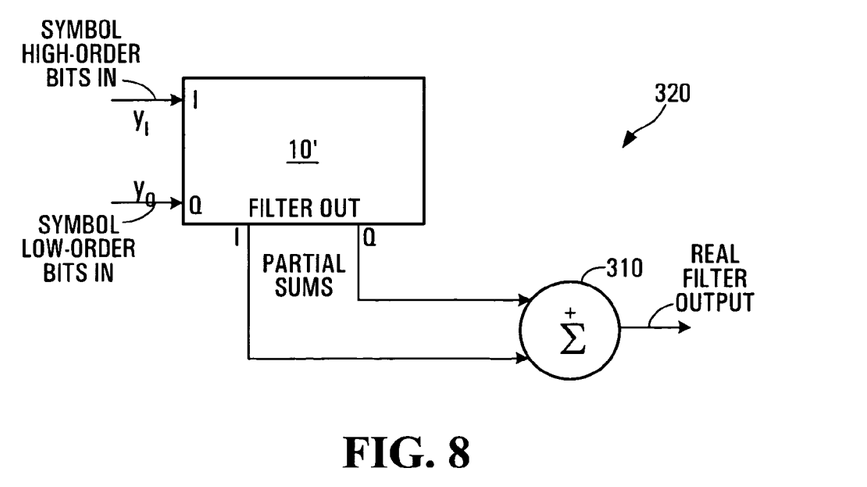
FIGS. 8-9 are schematic block diagrams of higher precision filters formed using the filter of FIGS. 5 and 6.

Likewise, filter 10" (FIG. 6) may be interconnected to calculate a double precision result as depicted in FIG. 8. That is, the real component $y_Q$ output by filter 10" could be treated as the more significant bits, while complex component $Y_I$ could be treated as the least significant bits of a high precision value. As required $y_Q$ and $y_I$ could be combined by a double precision summer 310.

Similarly, the summer of FIG. 8 could be used in place of adder 136 of filter 10' of FIG. 5. Buffer 112a and 112b could be loaded with most and least significant bits, respectively, of sixteen bit symbols S'. Coefficient storage 116 could similarly be loaded with sixteen bit precision values. Accumulators 134a and 134b would in turn calculate sums of least and most significant bits of the symbols and coefficients. As such, filter 10' operates as an eight tap filter on sixteen bit symbols and coefficients.

Figure 9:
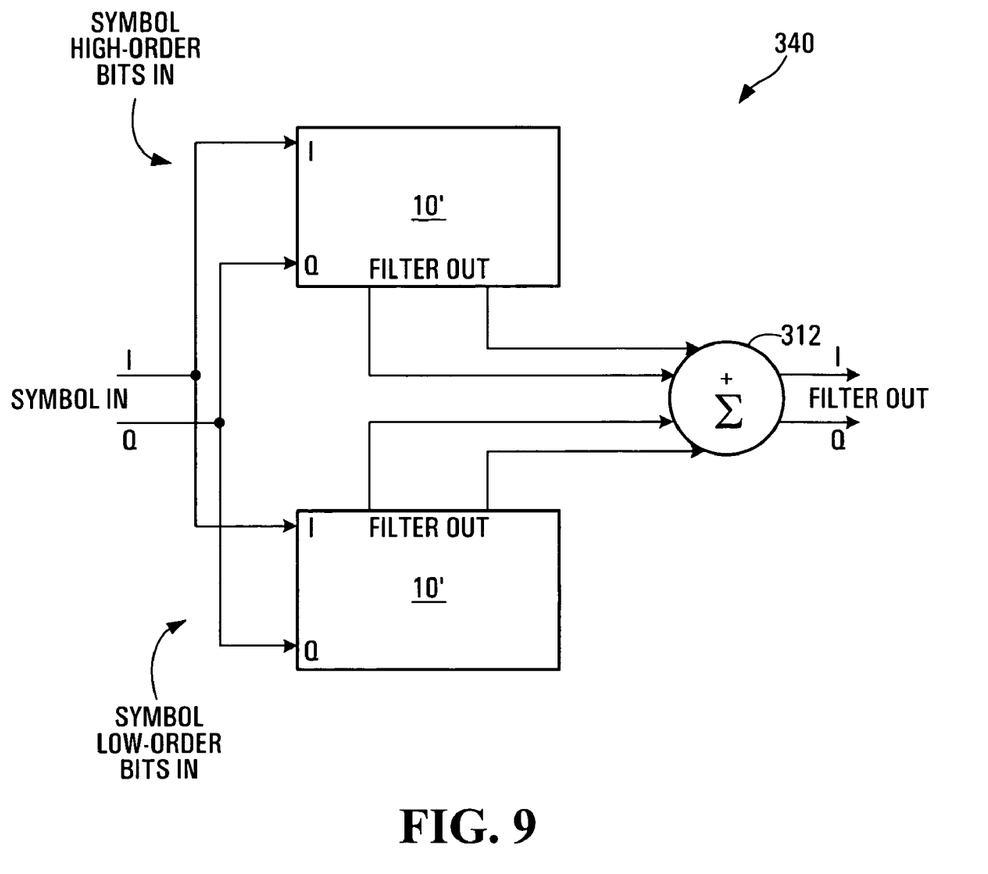

Multiple filters 10' could be interconnected as illustrated in FIG. 9 to calculate yet higher precision values. A summer 312 could attribute different precision significance to the component outputs of each filter 10'.

Of course, the above described embodiments are intended to be illustrative only and in no way limiting. The described embodiments of carrying out the invention are susceptible to many modifications of form, arrangement of parts, details and order of operation. The invention, rather, is intended to encompass all such modification within its scope, as defined by the claims.

What is claimed is:

1. A digital filter, comprising a symbol buffer having p−1 storage locations for storing arriving symbols, a coefficient memory having p−1 storage locations;
 a counter for counting from k=0 to p−1;
 a multiply and accumulate (MAC) block for multiplying and accumulating C(k)*S(n−k) from said storage locations of said symbol buffer and said coefficient memory;
 said counter providing control signals to cause said MAC block to calculate, $$\sum_{k=1}^{k=p-1} C(k) * S(n-k)$$

between the arrival of the $(n-1)^{th}$ and $n^{th}$ symbols; and, upon arrival of the $n^{th}$ of said symbols, calculating $$Y(n) = \sum_{k=0}^{k=p-1} C(k) * S(n-k);$$

and
wherein each location of said symbol buffer and said coefficient memory each store two real values; and
wherein said counter further provides control signals to cause said MAC block to calculate, $$\sum_{k=1}^{k=p-1} C(k+8) * S(n-8-k)$$

between the arrival of the $n-1^{th}$ and $n^{th}$ of said symbols;
between the arrival of the $n-1^{th}$ and $n^{th}$ of said symbols; and upon arrival of the $n^{th}$ of said symbols, calculates $$Y(n) = \sum_{k=0}^{k=p-1} S(n-k-8) * C(k+8).$$

2. The filter of claim 1, wherein said symbol buffer further comprises an advance input for shifting currently stored symbols within said buffer to adjacent ones of said storage locations of said symbol buffer.

3. The filter of claim 1, further comprising a selector in communication with said counter and interconnecting said symbol buffer to select one of said p−1 symbol buffer locations for presentation to said MAC block.

4. The filter of claim 1, wherein said symbol buffer and said coefficient memory stores complex values, and wherein said MAC block calculates complex products of values in said symbol buffer and said coefficient memory.

5. The filter of claim 4, wherein said MAC block comprises four multipliers and two adders to calculates said complex products of said complex values stored in said coefficient memory and said complex values stored in said symbol buffer.

6. The filter of claim 1, wherein said MAC block comprises a multiplier to simultaneously calculate the real product of one of said two real coefficients stored in said coefficient memory and one of said two real symbols stored in said symbol buffer, and a further multiplier to calculate the real product of the other of said two real coefficients stored in said coefficient memory and the other of said two real symbols stored in said symbol buffer.

7. The filter of claim 1, further comprising a symbol clock generator, in communication with said counter to reset said counter upon receipt of one of said symbols.

8. The filter of claim 1, further comprising a logic block interconnected with said coefficient memory to adaptively vary said coefficients with each of said symbols S(n).

9. A q tap filter, comprising two of said filters of claim 2, wherein the symbol buffer of said first filter is interconnected to the symbol buffer of the second of said two filters to provide one of its values to the symbol buffer of the second filter, as a buffer advance signal is received at said advance input.

10. A double precision filter, comprising a filter as claimed in claim 6, and a summer for summing the output of said multiplier and said further multiplier to form a double precision output.

11. A q tap filter, comprising:
 two filters, each of said two filters comprising:
  a counter for counting from k=0 to p−1;
  a multiply and accumulate (MAC) block for multiplying and accumulating C(k)*S(n−k) from said storage locations of said symbol buffer and said coefficient memory;
  said counter providing control signals to cause said MAC block to calculate, $$\sum_{k=1}^{k=p-1} C(k) * S(n-k)$$

between the arrival of the $(n-1)^{th}$ and $n^{th}$ symbols and upon arrival of the $n^{th}$ of said symbols, calculating $$Y(n) = \sum_{k=0}^{k=p-1} C(k) * S(n-k),$$

wherein said symbol buffer further comprises an advance input for shifting currently stored symbols within said buffer to adjacent ones of said storage locations of said symbol buffer; and wherein the symbol buffer of said first filter is interconnected to the symbol buffer of the second of said two filters to provide one of its values to the symbol buffer of the second filter, as a buffer advance signal is received at said advance input; and a symbol buffer having p−1 storage locations for storing arriving symbols, a coefficient memory having p−1 storage locations.

12. The filter of claim 11, further comprising a selector in communication with said counter and interconnecting said symbol buffer to select one of said p−1 symbol buffer locations for presentation to said MAC block.

13. The filter of claim 11, wherein said symbol buffer and said coefficient memory stores complex values, and wherein said MAC block calculates complex products of values in said symbol buffer and said coefficient memory.

14. The filter of claim 13, wherein said MAC block comprises four multipliers and two adders to calculates said complex products of said complex values stored in said coefficient memory and said complex values stored in said symbol buffer.

15. The filter of claim 11, wherein each location of said symbol buffer and said coefficient memory each store two real values.

16. The filter of claim 15, wherein said MAC block comprises a multiplier to simultaneously calculate the real product of one of said two real coefficients stored in said coefficient memory and one of said two real symbols stored in said symbol buffer, and a further multiplier to calculate the real product of the other of said two real coefficients stored in said coefficient memory and the other of said two real symbols stored in said symbol buffer.

17. The filter of claim 15, wherein said counter further provides control signals to cause said MAC block to calculate, $$\sum_{k=1}^{K=p-1} C(k+8)*S(n-8-k)$$

between the arrival of the n−1$^{th}$ and n$^{th}$ of said symbols;
between the arrival of the n−1$^{th}$ and n$^{th}$ of said symbols; and, upon arrival of the n$^{th}$ of said symbols, calculates $$Y(n) = \sum_{K=0}^{K=p-1} S(n-k-8)*C(k+8).$$

18. The filter of claim 11, further comprising a symbol clock generator, in communication with said counter to reset said counter upon receipt of one of said symbols.

19. A double precision filter, comprising:
a digital filter, said digital filter comprising:
a symbol buffer having p−1 storage locations for storing arriving symbols, a coefficient memory having p−1 storage locations;
a counter for counting from k=0 to p−1;
a multiply and accumulate (MAC) block for multiplying and accumulating C(k)*S(n−k) from said storage locations of said symbol buffer and said coefficient memory;
said counter providing control signals to cause said MAC block to calculate, $$\sum_{k=1}^{k=p-1} C(k)*S(n-k)$$

between the arrival of the (n−1)$^{th}$ and n$^{th}$ symbols and, upon arrival of the n$^{th}$ of said symbols, calculating $$Y(n) = \sum_{k=0}^{k=p-1} C(k)*S(n-k);$$

wherein each location of said symbol buffer and said coefficient memory each store two real values;
wherein said MAC block comprises a multiplier to simultaneously calculate the real product of one of said two real coefficients stored in said coefficient memory and one of said two real symbols stored in said symbol buffer, and a further multiplier to calculate the real product of the other of said two real coefficients stored in said coefficient memory and the other of said two real symbols stored in said symbol buffer; and
a summer for summing the output of said multiplier and said further multiplier to form a double precision output.

* * * * *